United States Patent
Beach et al.

(10) Patent No.: US 7,491,627 B2
(45) Date of Patent: Feb. 17, 2009

(54) III-NITRIDE DEVICE AND METHOD WITH VARIABLE EPITAXIAL GROWTH DIRECTION

(75) Inventors: Robert Beach, Altadena, CA (US); Paul Bridger, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 1 day.

(21) Appl. No.: 11/894,850

(22) Filed: Aug. 22, 2007

(65) Prior Publication Data

US 2007/0293015 A1    Dec. 20, 2007

Related U.S. Application Data

(62) Division of application No. 11/004,189, filed on Dec. 3, 2004, now Pat. No. 7,276,423.

(60) Provisional application No. 60/527,626, filed on Dec. 5, 2003.

(51) Int. Cl.
*H01L 21/36* (2006.01)
*H01L 21/20* (2006.01)

(52) U.S. Cl. ............... 438/483; 438/604; 257/E21.097; 257/E21.108; 257/E21.112; 257/E21.133

(58) Field of Classification Search ............. 438/483, 438/604, 606, 481; 257/E21.085, E21.086, 257/E21.09, E21.097, E21.098, E21.099, 257/E21.1, E21.104, E21.108, E21.112, E21.113, 257/E21.133, E21.138

See application file for complete search history.

(56) References Cited

U.S. PATENT DOCUMENTS

| | | | |
|---|---|---|---|
| 6,287,947 B1 * | 9/2001 | Ludowise et al. | 438/606 |
| 6,602,763 B2 * | 8/2003 | Davis et al. | 438/481 |
| 6,809,351 B2 | 10/2004 | Kuramoto et al. | |
| 6,881,651 B2 | 4/2005 | Koide et al. | |
| 6,986,693 B2 | 1/2006 | Chowdhury et al. | |
| 2002/0066403 A1 | 6/2002 | Sunakawa et al. | |
| 2002/0168844 A1 * | 11/2002 | Kuramoto et al. | 438/604 |
| 2003/0162340 A1 | 8/2003 | Tezen | |
| 2005/0269593 A1 | 12/2005 | Chowdhury et al. | |

* cited by examiner

*Primary Examiner*—Caridad M Everhart
(74) *Attorney, Agent, or Firm*—Ostrolenk, Faber, Gerb & Soffen, LLP

(57) ABSTRACT

A semiconductor device composed of III-nitride materials is produced with epitaxial growth that permits vertical and lateral growth geometries to improve device characteristics. The resulting device has a greater breakdown voltage due to the greater integrity of the semiconductor material structure since no ion implantation processes are used. The epitaxially grown layers also exhibit greater thermal conductivity for improved operation with power semiconductor devices. The device may include a laterally grown charge compensated area to form a superjunction device. The resulting device may be bidirectional and have improved breakdown voltage in addition to higher current capacity for a given voltage rating.

12 Claims, 2 Drawing Sheets

III-NITRIDE DEVICE AND METHOD WITH VARIABLE EPITAXIAL GROWTH DIRECTION

RELATED APPLICATION

The present application is a division of U.S. application Ser. No. 11/004,189, filed Dec. 3, 2004 now U.S. Pat. No. 7,276,423, entitled III-Nitride Device and Method With Variable Epitaxial Growth Direction which is based on and claims benefit of U.S. Provisional Application No. 60/527,626, filed Dec. 5, 2003, entitled Epitaxially Grown Vertical Base Bipolar MOS Transistor, to which a claim of priority is hereby made, and the disclosure of which is incorporated herein by reference.

BACKGROUND OF THE INVENTION

1. Field of the Invention

The present invention relates generally to the construction of III-nitride devices using epitaxial growth, and relates more particularly to the construction of III-nitride devices where the epitaxial growth is variable in direction to obtain variable doping profiles without implantation.

2. Description of Related Art

In the construction of semiconductor devices, doping of various portions of semiconductor material is achieved according to a number of different techniques. One of the more popular techniques is the implantation of ions using a beam, and driving the implanted impurities to diffuse into the semiconductor material in which the implant is made. The implantation of ions according to these typical techniques often involve high energy collisions between the implanted ions and the lattice structure of the semiconductor material to be implanted. Accordingly, structural damage to the lattice of the semiconductor material is a typical and well known byproduct of the doping process.

As integrated circuit become more sophisticated, complicated doping profiles and geometries are used to achieve better performance and critical parameter values. However, as more complicated implantation processes are conducted, a significant amount of structural damage to the implanted semiconductor material is observed. The structural damage to the lattice of the implanted semiconductor material tends to degrade the performance of the devices in certain critical areas, such as breakdown voltage.

Power semiconductor devices are often constructed with MOSgated switches to take advantage of the low on resistance to reduce power losses. MOSgated switches are typically constructed using ion implantation, as discussed above, and are usually rated for a particular voltage. Accordingly, due to the deterioration of the semiconductor material caused by ion implantation, MOSgated switches typically need to be constructed with additional voltage blocking capacity to compensate for the reduced blocking ability caused by the implantation process. In addition, MOSgated switches are typically specified to have a given current carrying capacity for a given voltage rating. The current carrying capacity is limited by the carrier density in the voltage standoff region. Some geometries have been presented for construction of MOSgated devices that improve the current capacity versus voltage standoff relationship, where charge compensation is provided in the MOSgated switch base. These types of devices are often referred to as superjunction devices. However, the devices continue to be limited by the use of ion implantation for doping and the attendant damage to the lattice of the semiconductor structure, leading to lower breakdown voltages.

III-nitride semiconductors are presently known that exhibit a large dielectric breakdown field of greater than 2.2 mv/cm. III-nitride heterojunction structures are also capable of carrying extremely high currents, which makes devices fabricated in the III-nitride material system excellent for power applications. Devices fabricated in the III-nitride material system can exhibit high electron mobility and are referred to variously as heterojunction field effect transistors (HFETs), high electron mobility transistors (HEMTs) or modulation doped field effect transistors (MODFETs). These types of devices typically operate through the use of piezoelectric polarization fields to generate a two dimensional electron gas (2DEG) that allows transport of very high current densities with very low resistive losses. The 2DEG is formed at an interface of two III-nitride material layers having different concentrations of III-nitride materials. Due to the nature of the interface, fundamentally formed III-nitride semiconductor devices tend to be nominally on, or depletion mode devices.

Materials in the III-nitride material system may include gallium, aluminum and indium, as well as their nitrides, GaN, AlN and InN. Gallium nitride and its alloys such as aluminum gallium nitride (AlGaN), indium gallium nitride (InGaN) and indium aluminum gallium nitride (InAlGaN) are also included in this material system. These materials represent semiconductor compounds that have a relatively wide direct bandgap that permits highly energetic electronic transitions to occur. Gallium nitride materials have been formed on a number of different substrates including silicon carbide (SiC), sapphire and silicon. Silicon substrates are readily available and relatively inexpensive, and silicon processing technology is well developed. Epitaxial growth of III-nitride materials to form semiconductor structures has also been well developed, and results in decreased complexity in manufacturing, as well as providing superior thermal performance.

SUMMARY OF THE INVENTION

In accordance with the present invention, there is provided a structure and method for producing III-nitride devices with various doping profiles without the use of ion implantation. Anisotropic growth of III-nitride materials over regions of masked material permits devices to be constructed with desired doping concentrations while avoiding the use of ion implantation. The growth of the III-nitride material can be precisely controlled to permit vertical or horizontal growth patterns, along with attendant doping to obtain a variety of doping geometries and profiles. This type of control over both horizontal and vertical doping profiles can be used to produce a number of unique devices with improved performance over previous devices fabricating using conventional techniques. Because the III-nitride material is grown to a desired structure formation, the resulting material exhibits improved breakdown characteristics over prior devices, along with the attendant advantages of good thermal conductivity realized from epitaxially grown structures.

According to an exemplary embodiment of the present invention, a MOSgated device is provided with an epitaxially grown vertical base. The structure is produced by growing an N-type layer of semiconductor material including a III-nitride component on a suitable substrate. Suitable substrates include those comprising III-nitride materials, sapphire, SiC, Si or other suitable materials. A mask is applied to the N-type doped layer and patterned to exposed particular portions of the doped layer. Examples of suitable masking materials include silicon dioxide, silicon nitride, HF dioxide, and others. After the formation of the mask, additional growth is initiated on the doped layer not covered by the mask to form vertically oriented structures including permittal or columnar shapes. The shape of the grown semiconductor material over the exposed portions of the mask depends upon the stoichiometry, temperature and other parameters employed during the growth cycle. These parameters can be accurately controlled to produce desired profiles and geometries. Following the growth step, the new layers may be etched and processed to provide contacts or otherwise complete a MOSgated switch as desired.

According to a feature of the present invention, control of the regrowth permits a lightly doped region to be formed vertically, followed by a heavily doped region formed horizontally. The regions of can be of either N or P-type conductivity. Horizontal or vertical growths may subsequently be applied with any type of conductivity type doping to form desired geometries.

In accordance with an advantage of the present invention, a semiconductor device obtained through the growth techniques described herein obtains significant advantages over ion implantation vertical devices, as well as horizontal base devices. Advantageously, breakdown voltage is increased due to the elimination of damage caused by ion implantation. Furthermore, the resulting devices have an increased current carrying capacity for a given voltage rating due to the higher carrier density in the voltage standoff region. The unique geometries permitted by the techniques of the present invention permit higher performance in comparable devices due to, for example, charge compensation in the vertical base.

According to another advantage of the present invention, a vertical base may be fabricated without etching and regrowth, as is traditionally done in a fabrication of silicon based devices. In particular, the present invention eliminates the additional and complex processing typically associated with the construction of vertical based superjunction devices in silicon.

According to another aspect of the present invention, epitaxial lateral overgrowth (ELO) is used to form vertically oriented regions with alternating conductivity types. The geometries of the alternating regions may be oriented to optimize particular device characteristics. This technique avoids implantation and etching to obtain vertically oriented alternating conductivity type regions which were formerly constructed using complex and resource intensive processes.

Other features and advantages of the present invention will become apparent from the following description of the invention which refers to the accompanying drawings.

DETAILED DESCRIPTION OF THE PREFERRED EMBODIMENTS

Figure 1:
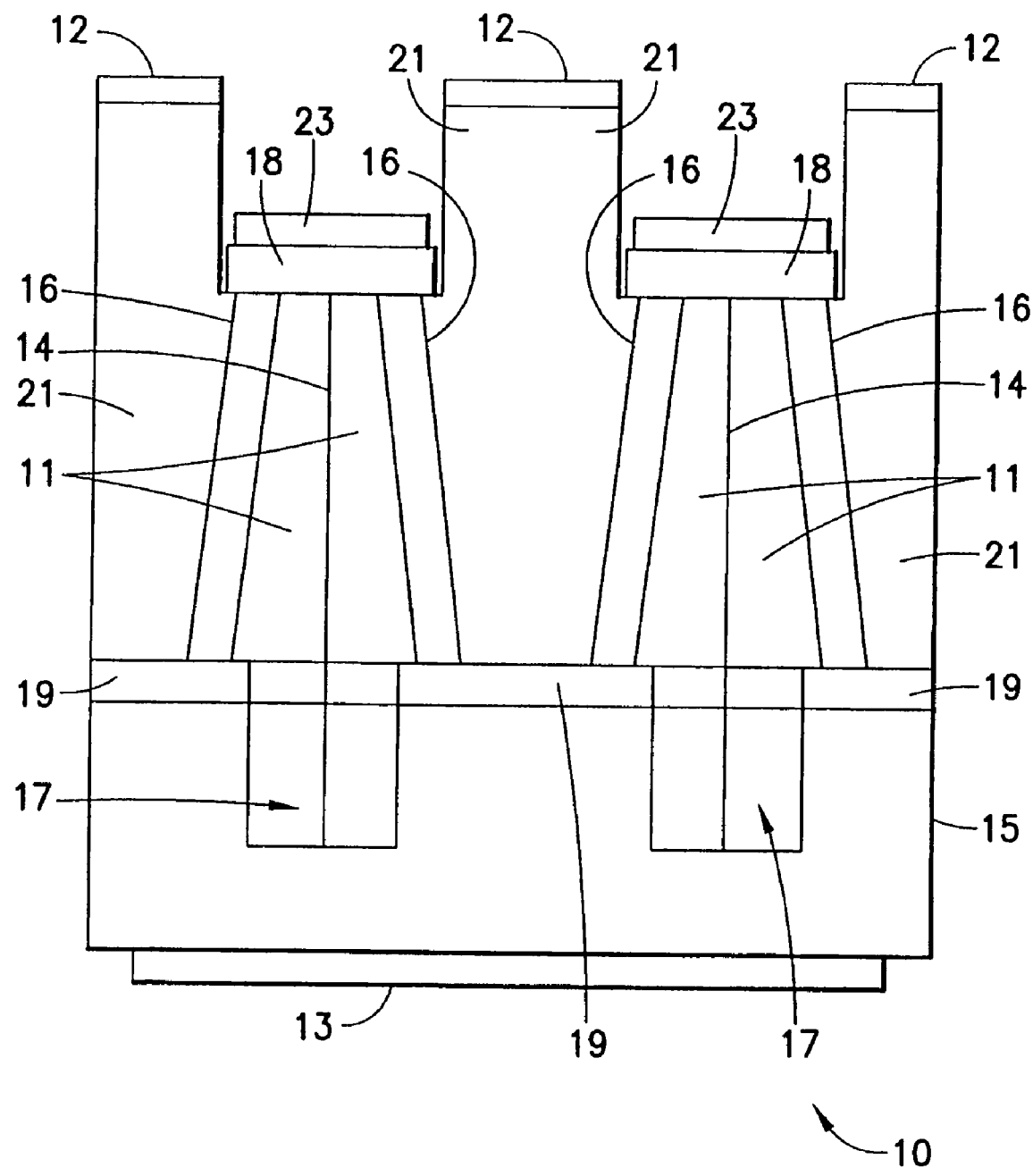
FIG. 1 is a cross-sectional view of an epitaxial grown vertical base semiconductor device in accordance with the present invention.

Referring now to FIG. 1, an exemplary embodiment of an epitaxially grown vertical based III-nitride device 10 is illustrated. Device 10 is a bipolar MOS transistor. It is a vertical conduction device with ohmic contacts 12, 13 providing high current connections to device 10. Contacts 12, 13 are typically thought of as source and drain contacts, respectively. In MOSgated silicon devices, however, such a naming convention should not be construed to mean that device 10 is a unipolar device, or is operable in a single direction. Accordingly, contacts 12, 13 are referred to as ohmic contacts, or source/drain contacts interchangeably without limitation to the conduction direction or carriers used in device 10.

Device 10 includes a substrate 15 composed of a suitable material such as silicon, silicon carbide, III-nitride materials and so forth. Substrate 15 may be etched or grown to form trenches 17. A dielectric or protective layer 19 overlays substrate 15, and can be used as a mask to form trenches 17. Dielectric or protective layer 19 also provides a pattern for the formation of epitaxially grown portions 11, that fill in trenches 17 and overgrow layers 19, while being doped according to a desired conductivity profile. For example, regions 11 may be doped to have N or P-type conductivity. In the exemplary embodiment of device 10, regions 11 are grown to have columnar shapes with tapered sidewalls through the appropriate application of growth conditions, including stoichiometry, temperature and so forth. A growth of regions 11 with the specified doping profile forms a defective region 14 where the growth of regions 11 forms a border. Defect regions 14 do not impair the operational qualities of device 10, since regions 11 each provide a good epitaxial structure for conducting current.

Switching functionality of device 10 is achieved through the deposition of barrier layers 16, which may be composed of semiconductor material with a conductivity type that is opposite to that of regions 11. Layers 16 may be grown epitaxially with a specified doping profile, and contain some percentage of a III-nitride material to permit layers 16 to act as barrier layers. Barrier layers 16 extend from protective layers 19 to a dielectric layer 18, which operates as a gate dielectric in the exemplary embodiments represented by device 10.

Another epitaxial growth step is initiated following the deposition of layers 16 to form conductive regions 21, which have a specific doping profile for the desired parameters of the resulting device. Regions 21 may be doped to have the same conductivity type as regions 11, and opposite to regions 16, to form a PNP or NPN device, as desired. A doping profile may be provided during the growth of regions 21, as with the other growth regions, to obtain particular characteristics for device operation. For example, the doping profile may be provided as a gradient to improve device performance in certain operating ranges. Dielectric layers 18 may be provided prior to the growth of regions 21, to act as a mask to control the geometry of regions 21 during the growth sequence. Optionally, another material may be deposited in the same location prior to the formation of dielectric 18 to act as the mask during the growth sequence. In such a case, the mask material is removed after the growth sequence, and dielectrics 18 are deposited atop regions 11 and 16 to attain the desired MOSgated operation.

When the growth of regions 21 is completed, ohmic contacts 12 may be applied to provide connections for device 10. Gate contacts 23 may then be formed atop gate dielectric layers 18 and the device may be completed according to normal procedures, such as the addition of cladding or passivation layers and electrode structures commonly used in MOS devices.

The materials used to form the active regions of device 10 include components or alloys of III-nitride materials. For example, substrate 15 may include some percentage of GaN or other III-nitride materials. Epitaxially grown regions 11 may also be composed of a percentage of GaN or other III-nitride materials, and may be compositionally graded during the growth cycle used to form regions 11. Layers 16 may be formed to contain some percentage of AlGaN and/or other III-nitride materials or alloys. Epitaxially grown regions 21 may include some percentage of GaN or other III-nitride materials or alloys, and may be compositionally graded during the growth cycle.

Device 10 is a nominally off device, and operates in enhancement mode with the application of an electric potential to gates 23. The potential applied to gates 23 inverts the conductivity type of layers 16 to form a channel under gates 23 between regions 11 and 21. The channel is composed of high mobility electrons to enable high current capacity when device 10 conducts. When no electric potential is applied to gates 23, barrier layer 16 blocks current in device 10 and permits device 10 to exhibit a high breakdown voltage by being able to standoff large voltages that may be realized between regions 11 and 21. Device 10 is also a bipolar device, meaning that a simplified design for high power applications, such as motor drives, can be realized that were difficult or more complex when realized in silicon. In addition, device 10 has much better performance than bidirectional silicon counterparts due to the advantages obtained in the III-nitride material system.

Figure 2A:
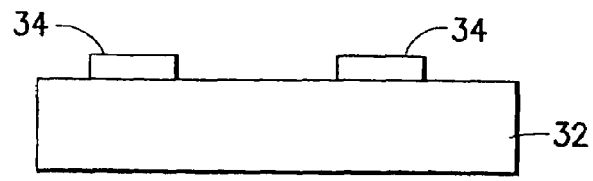
FIGS. 2A-2E are cross-sectional views of a semiconductor device according to the present invention in various stages of fabrication.

Referring now to FIGS. 2A-2E, a method for constructing an alternate exemplary embodiment of the present invention is illustrated with respect to a device 30. In FIG. 2A, a substrate 32 is used as a basis for the construction of device 30. Substrate 32 may be composed of an sufficient material, depending upon the device to be realized. For example, insulating substrates may be formed of III-nitride material, silicon, silicon carbide or sapphire, among others. Conductive substrates may be formed with III-nitride materials, silicon and silicon carbide, among others. A protective layer is deposited and patterned to form blocks 34 that are used to define the growth pattern of device 30.

Figure 2B:
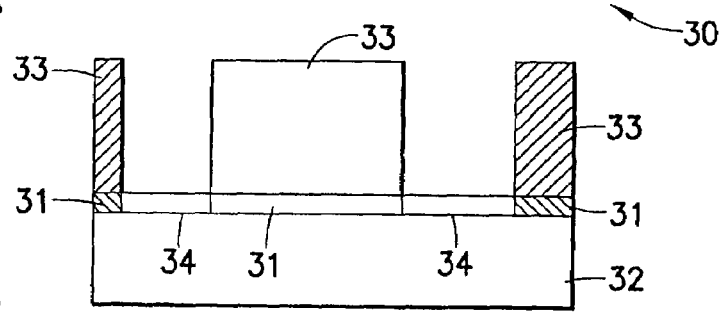

Referring now to FIG. 2B, vertical growth is initiated to form highly doped regions 31 and lightly doped regions 33. Regions 31 and 33 may be grown sequentially, and differentiated by the doping profile applied during the time interval of growth for each specific region. Although regions 31 and 33 are illustrated as having a somewhat rectilinear form, any type of geometry may be attained through the use of the epitaxial lateral overgrowth process used to form regions 31 and 33. In addition, any type of doping profile or alloy compounds may be used to form regions 31 and 33, depending upon device characteristics or desired performance parameters, for example.

Figure 2C:
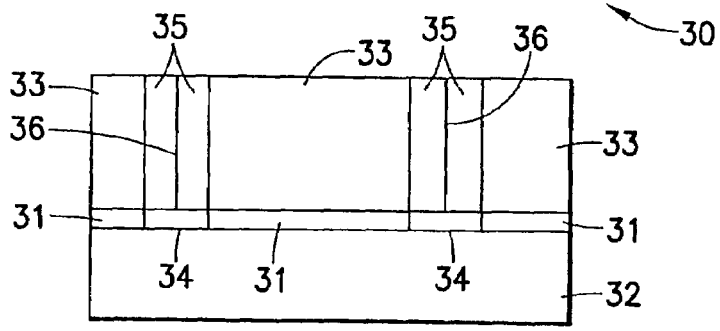

Referring now to FIG. 2C, a lateral growth of semiconductor material with a III-nitride percentage composition is initiated. Lateral growth regions 35 typically have a conductivity type that is opposite to that of regions 31 and 33 to form a semiconductor junction. The lateral growth of regions 35 results in a defect area 36 where the regions meet during the growth cycle. Defect region 36, however, does not impact the performance of device 30. During the epitaxial growth cycle, regions 35 can be doped to be in charge balance with regions 33, to form a superjunction type device. Charge balance is more readily attained in device 30 due to the accurate control of parameters during the growth of regions 35. Prior devices using implantation methods were not able to achieve the level of accuracy possible in the epitaxial growth processes used to form regions 33 and 35. It should be noted that regions 35 grow laterally over protective blocks 34 to form the device according to the present invention.

Protective blocks 34 may be composed of SiO2, HfO2, SiN and other suitable materials for defining the basis of the epitaxially grown regions 31 and 33, and to form overgrown regions 35.

Figure 2D:
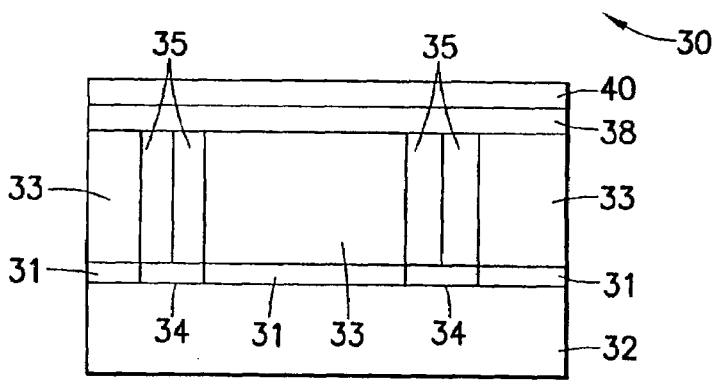

Referring now to FIG. 2D, vertically grown layers 38 and 40 are formed atop regions 33 and 35. Layer 38 is highly doped, and may have a conductivity type that is opposite that of regions 33. Layer 40 is also grown atop layer 38, and may have a conductivity type opposite to that of layer 38. Accordingly, the combination of regions 33 and layers 38, 40 form a PNP or NPN device. The composition of layers 38 and 40 includes a percentage of III-nitride materials to form blocking and conductive layers in device 30. Layers 38 and 40 may be grown with a particular geometry, doping profile or composition profile to achieve desired device parameters or operational characteristics. Device 30 illustrated in FIG. 2D is thus formed to have an active area that is epitaxially grown to have superior conductivity and blocking capabilities, as well as excellent thermal conductivity properties.

Figure 2E:
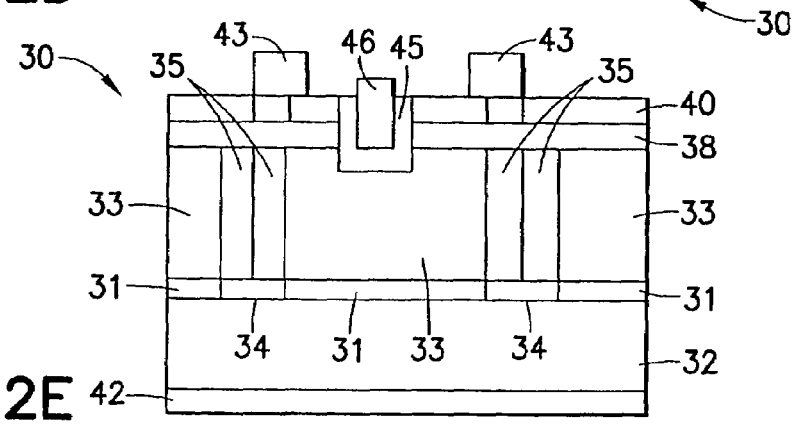

Referring now to FIG. 2E, device 30 is processed to form a completed device, including ohmic contacts 42, 43. Ohmic contact 42 is deposited on substrate 32 to form an electrode of device 30, typically referred to as a drain contact. Ohmic contacts 43 are performed atop layer 40 to provide a connection to layer 40. A recess is formed through layers 38 and 40 to provide a region for a gate contact 46. A gate dielectric 45 is formed in the recess to isolate gate contact 46 from layers 38 and 40.

Completed device 30 operates as a nominally off, or enhancement mode device, that does not conduct without the application of an electric potential through gate 46. Layer 38 acts as a blocking layer to prevent current flow between regions 33 and layer 40. When device 30 is not conducting, and standing off large voltages, the charge balance provided by regions 35 cause the complete depletion of regions 33 to further improve breakdown voltage, without significant penalties for on resistance.

When device 30 is turned on through the application of an electric potential to gate 46, a conductivity inversion region is locally formed near gate contact 46 in layer 38. The electric potential applied to gate contact 46 can be either positive or negative, depending upon the conductivity type of layer 38. With the local inversion of layer 38 near gate contact 46, a conduction channel is formed between layers 40 and 33. In this state, device 30 provides a high mobility conduction channel capable of carrying large amounts of current. Device 30 is also a bipolar device, making it a flexible, high performance device suitable for a wide range of applications.

It should be apparent that although a bipolar switching device is described with reference to the Figures, the present invention is equally applicable to any type of power electronic device, including rectifiers, schottky diodes, pinch resistors and the like. For example, although the described devices are shown with ohmic contacts, schottky contacts may alternately be formed, or in addition with the ohmic contacts to achieve a wide variety of devices. The important aspects of the present invention provided for any of these semiconductor devices is the combination of growth geometries with doping profiles that eliminates the need for ion implantation, to improve the overall performance of the resulting device.

The present invention describes the use of epitaxial lateral overgrowth to form vertically oriented regions of alternating doping types, for example, and novel doping geometries. Accordingly, the present invention avoids ion implantation, and etching that is typically associated with conventional silicon technology. The anisotropic growth of III-nitride materials over masked regions produce laterally varying doping profiles to produce a number of unique characteristics and devices with improved performance.

According to a particular embodiment of the present invention, a bipolar device is constructed using highly doped GaN atop a suitable substrate followed by a masking layer that is patterned to expose portions of the GaN layer. The masking material acts to suppress growth over the masked regions, while the exposed regions grow vertically through the mask openings to form vertical shapes with particular geometries, such a permittal or columnar. The shape of the vertical structures depends upon the stoichiometry, temperature and other aspects of the growth conditions, and these can be controlled with a high degree of accuracy. The control of growth direction permits the formation of a lightly doped GaN region grown vertically, followed by a heavily doped GaN region having an opposite conductivity type grown horizontally. The growth of these regions may be followed by the growth of another GaN region with a conductivity type opposite to that upon which it is grown. The grown structure may then be etched and processed to include gate dielectrics and contacts, for example. The resulting device represents significant improvements in performance in breakdown voltage and current capacity, due to the elimination of damage in the semiconductor material that would otherwise result from ion implantation. Higher current capacity results from greater carrier density in the voltage standoff region constructed according to the particular device geometry. The charge compensation of the vertical base also contributes to improve the carrier density in the voltage standoff region for the resulting device.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of fabricating a semiconductor device comprising:

forming a protective layer over a substrate;

patterning said protective layer to obtain a plurality of spaced blocks;

growing a plurality of first III-nitride bodies in regions between said blocks;

growing a second III-nitride body of a conductivity type opposite to that of said first III-nitride bodies on each said first III-nitride body and laterally over a respective block, said second III-nitride bodies being in charge balance with said first III-nitride bodies; and forming a semiconductor device over said first III-nitride bodies and said second III-nitride bodies.

2. The method of claim 1, wherein said substrate comprises a III-nitride material.

3. The method of claim 1, wherein said substrate comprises silicon.

4. The method of claim 1, wherein said substrate comprises SiC.

5. The method of claim 1, wherein said protective layer comprises silicon dioxide.

6. The method of claim 1, wherein said protective layer comprises hafnium dioxide.

7. The method of claim 1, wherein said protective layer comprises silicon nitride.

8. The method of claim 1, wherein said growing said first III-nitride bodies includes growing first III-nitride layers of one conductivity and growing second III-nitride layers of another conductivity each over a respective first III-nitride layer.

9. The method of claim 1, wherein each said first III-nitride layer is highly doped, and each said second III-nitride layer is lightly doped.

10. The method of claim 1, wherein said forming said semiconductor device includes vertically growing a III-nitride layer of a conductivity opposite to said first III-nitride bodies over said first and second III-nitride bodies, growing another III-nitride layer of a conductivity opposite to that of said III-nitride layer over said III-nitride layer, and forming ohmic contacts over said III-nitride layer, and an ohmic contact over said substrate.

11. The method of claim 10, further comprising forming a recess through said III-nitride layer and said another III-nitride layer, and forming a gate dielectric and a gate contact in said recess.

12. The method of claim 11, wherein said ohmic contacts over said another III-nitride layer extend to said III-nitride layer.

* * * * *